(12) United States Patent
Marion et al.

(10) Patent No.: US 9,166,338 B2
(45) Date of Patent: Oct. 20, 2015

(54) CONNECTING ELEMENTS FOR PRODUCING HYBRID ELECTRONIC CIRCUITS

(71) Applicant: Comissariat A L'Energie Atomique Et Aux Energies Alternatives, Paris (FR)

(72) Inventors: Francois Marion, Saint-Martin le Vinoux (FR); Baptiste Goubault de Brugiere, La Buisse (FR); Stéphane Lagarrigue, Rives (FR); Marion Volpert, Sassenage (FR); Michel Heitzmann, Crolles (FR)

(73) Assignee: Commissariat A L 'Energie Atomique Et Aux Energies Alternatives, Paris (FR)

( * ) Notice: Subject to any disclaimer, the term of this patent is extended or adjusted under 35 U.S.C. 154(b) by 140 days.

(21) Appl. No.: 13/858,312

(22) Filed: Apr. 8, 2013

(65) Prior Publication Data

US 2013/0267113 A1 Oct. 10, 2013

Related U.S. Application Data

(63) Continuation of application No. PCT/FR2011/052413, filed on Oct. 17, 2011.

(30) Foreign Application Priority Data

Nov. 5, 2010 (FR) ...................................... 10 59129

(51) Int. Cl.
*H01R 12/00* (2006.01)
*H01R 13/64* (2006.01)
*H01L 23/00* (2006.01)
*H01R 43/16* (2006.01)

(52) U.S. Cl.
CPC ............... *H01R 13/64* (2013.01); *H01L 24/11* (2013.01); *H01L 24/13* (2013.01); *H01L 24/16* (2013.01); *H01L 24/81* (2013.01); *H01L 24/90* (2013.01); *H01R 43/16* (2013.01); *H01L 2224/1147* (2013.01); *H01L 2224/11472* (2013.01)

(Continued)

(58) Field of Classification Search
USPC .................................................... 439/74, 246
IPC ................ H01R 23/725,9/096, 12/57, 13/6315
See application file for complete search history.

(56) References Cited

U.S. PATENT DOCUMENTS 2,126,117 A * 8/1938 Kasdorf ........................ 493/154
2,356,023 A * 8/1944 Alles ............................. 428/198

(Continued)

FOREIGN PATENT DOCUMENTS

| FR | 2 042 800 A6 | 2/1971 |
| FR | 2 928 033 A1 | 8/2009 |
| FR | 2 936 359 A1 | 3/2010 |
| JP | 01-226160 A1 | 9/1989 |

OTHER PUBLICATIONS

International Search Report dated Mar. 8, 2012.

*Primary Examiner* — Hien Vu
(74) *Attorney, Agent, or Firm* — Burr & Brown, PLLC

(57) ABSTRACT

A connecting system having a female element including a hollow flared part for receiving and guiding a male element and a hollow mating part for mating with the male element. A part to be mated of the male element has an outside diameter that before the mating is larger than an inside diameter of the mating part of the female element, and the part to be mated of the male element is made of a material that can be strained and has a corrugated transverse cross section, so as to contract when it is plugged into the mating part of the female element, and/or the mating part of the female connection element is made of a material that can be strained and has a corrugated transverse cross section, so as to dilate when the part to be mated of the male element is plugged into it.

4 Claims, 6 Drawing Sheets

(52) U.S. Cl.
CPC ........... *H01L 2224/11901* (2013.01); *H01L 2224/131* (2013.01); *H01L 2224/13099* (2013.01); *H01L 2224/81141* (2013.01); *H01L 2224/81191* (2013.01); *H01L 2224/81193* (2013.01); *H01L 2224/81899* (2013.01); *H01L 2224/83141* (2013.01); *H01L 2224/83907* (2013.01); *H01L 2924/0001* (2013.01); *H01L 2924/01005* (2013.01); *H01L 2924/01029* (2013.01); *H01L 2924/01049* (2013.01); *H01L 2924/01057* (2013.01); *H01L 2924/01058* (2013.01); *H01L 2924/01074* (2013.01); *H01L 2924/01075* (2013.01); *H01L 2924/01078* (2013.01); *H01L 2924/01079* (2013.01); *H01L 2924/01087* (2013.01); *H01L 2924/01327* (2013.01)

(56) References Cited

U.S. PATENT DOCUMENTS

| | | | |
|---|---|---|---|
| 3,168,209 | A * | 2/1965 | Brookins al. ............ 150/154 |
| 3,578,425 | A | 5/1971 | Wright et al. |
| 4,693,919 | A * | 9/1987 | Languillat et al. ......... 428/34.2 |
| 4,846,929 | A | 7/1989 | Bard et al. |
| 5,457,879 | A | 10/1995 | Gurtler et al. |
| 5,669,774 | A | 9/1997 | Grabbe |
| 5,928,005 | A | 7/1999 | Li et al. |
| 8,172,591 | B2 * | 5/2012 | Wertz ........................ 439/246 |
| 2003/0044521 | A1 | 3/2003 | Gan et al. |
| 2005/0282411 | A1 | 12/2005 | Fork et al. |
| 2008/0169563 | A1 | 7/2008 | Awano et al. |
| 2010/0072631 | A1 | 3/2010 | Marion |
| 2011/0094789 | A1 | 4/2011 | Marion et al. |

* cited by examiner

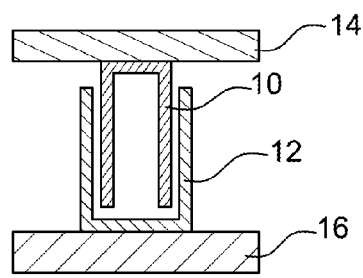
Fig. 1
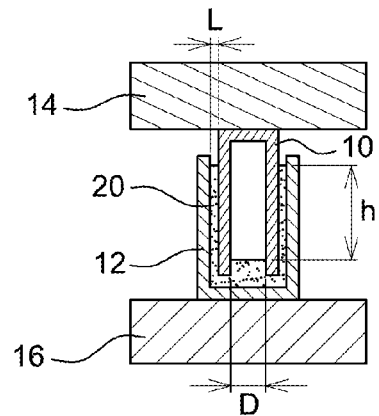
Fig. 2
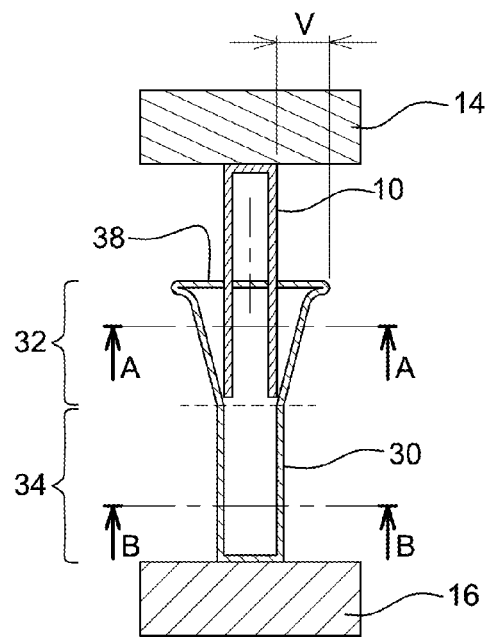
Fig. 3
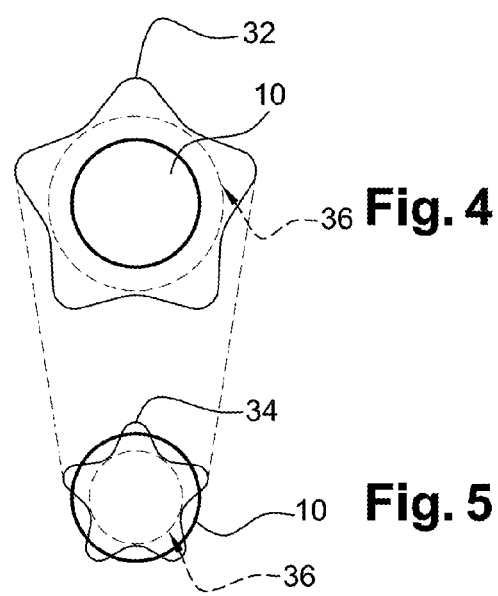
Fig. 4
Fig. 5

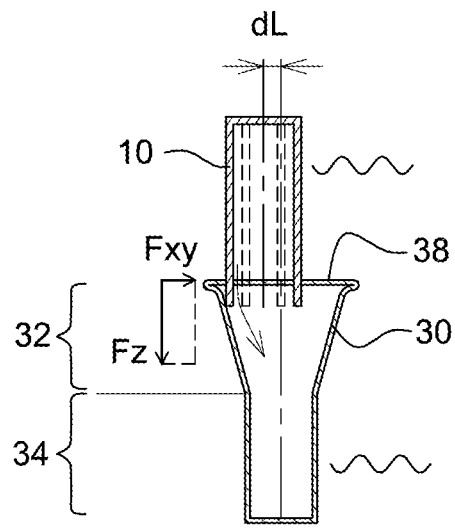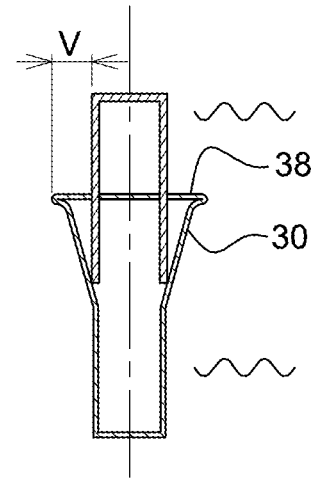
Fig. 6　　Fig. 7
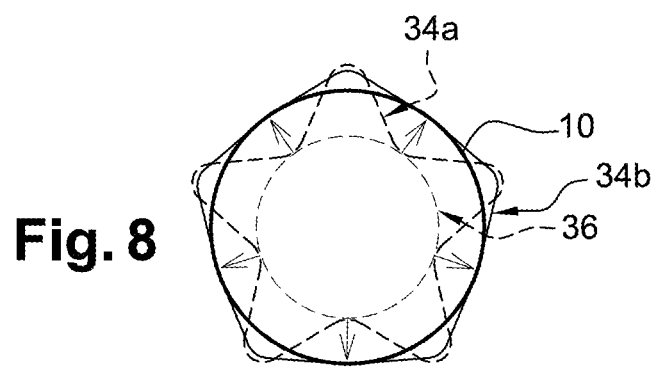
Fig. 8

CONNECTING ELEMENTS FOR PRODUCING HYBRID ELECTRONIC CIRCUITS

BACKGROUND OF THE INVENTION

1. Field of the Invention

The invention relates to the interconnection of electronic components, and especially applies in flip-chip type hybridizations.

2. Description of Related Art

"Flip-chip" hybridization or "face-to-face" hybridization generally comprises forming two electronic circuits independently from each other, and placing them one on top of the other by means of interconnects both ensuring the positive mechanical connection function and the electric connection function. For example, an imager comprises, on the one hand, an array detection circuit comprising an array of photosites sensitive to electromagnetic radiation and, on the other hand, a circuit comprising electronics for reading the array of photosites. The two circuits are usually manufactured independently from each other, and then hybridized.

The first flip-chip hybridization comprised hybridizing circuits by means of solder balls, usually made of indium which, once solid, would positively connect the circuits together while forming electric connections. This type of hybridization however does not allow a high density of connections per surface area unit, and thus imposes a limit to the miniaturization of electronic components. Further, a step of heating under a reducing atmosphere is necessary during the hybridization to melt the solder balls, thereby preventing the use of materials or electronic components which cannot withstand such a heating.

Finally, the hybridization by means of a soldering is definitive since it requires creating intermetallic compounds between the solder material and the material having the soldering performed thereon. The material having the soldering performed thereon is thus modified and cannot be used twice. Part of the solder is further consumed, making a separation and resoldering impossible without losing quality. The definitive character of the soldering is strongly limiting in terms of quality control and of defective circuit repair. Thus, for example, to test the operation of the imager detection circuit, it is necessary to couple it with a read circuit. Since this coupling is performed by soldering, the read circuit in charge of the test is thus necessarily the final read circuit. As a result, if the detection circuit appears to be defective, the read circuit is also rejected since it is permanently coupled thereto, even though it would be perfectly operable. Similarly, in case of a failure of one or the other of the circuits, replacing the defective circuit is impossible. The hybrid assembly is then rejected, thus including the circuit still in perfect operating condition.

More recently, an alternative to solder balls, schematically illustrated in FIG. 1 and described in document FR 2936359, provides the forming of male and female cylindrical inserts 10 and 12 on surfaces of a first and of a second circuit 14, 16, and the placing of first circuit 14 on second circuit 16 by insertion of male insert 10 into female insert 14.

Although the manufacturing of such inserts is possible with a high surface area density due to the techniques used, this solution is in practice poorly viable. Indeed, male insert 10 and female insert 12 should form together a reliable electric connection, which thus means that the external diameter of male insert 10 is substantially equal to the internal diameter of female insert 12 for their surfaces to be in contact. The insert manufacturing process should thus be extremely precise, just as the process of insert alignment for the insertion of the male insert into the female insert.

Document JP 01226160 provides a similar interconnection, the main difference being that the male insert is solid and has an external diameter selected to obtain a force-fitting into the female insert with a resilient and plastic deformation thereof. Here again, this requires a very high precision in manufacturing and alignment processes. Further, due to the materials used, that is, metals to obtain an electric connection, the deformation of the female insert is non-reversible. Indeed, the male and female inserts are interconnected by force-fitting by using a plastic deformation of the materials, and thus an irreversible deformation thereof. Once hybridized, it is thus no longer possible to separate the two circuits without causing the destruction of the female elements.

To overcome these problems, it is possible to fill the female insert with a solder material 20, as illustrated in FIG. 2 and described in document FR 2936359. Thereby, solder material 20 forms an electric joint between male insert 12 and female insert 14, thus enabling to slacken the constraints relative to their manufacturing or alignment precision.

The reintroduction of a solder material in the circuit interconnection however brings about disadvantages inherent to this type of hybridization, that is, the need for a heating, as well as the definitive aspect of the hybridization, as previously explained.

SUMMARY OF THE INVENTION

The present invention aims at providing an interconnect which does not require using a high-precision manufacturing and alignment process, which does not require the use of solder material, and which is reversible. It also aims at doing away with the issue relative to the guiding of the connection elements with respect to each other.

For this purpose, the invention aims at a female connection element comprising a hollow flared portion for receiving and guiding a male connection element and a hollow mating portion, formed in extension of the flared portion, for mating with the male connection element, wherein the mating portion is made of a deformable material and has a corrugated transverse cross-section having an internal diameter before the mating smaller than the external diameter of the male element before the mating, to expand when the part to be mated of the male connection element is fitted into it.

In other words, the flared shape of the female element enables to receive a male element without requiring an accurate alignment and to guide it towards the portion of the female element with which it is intended to cooperate to form the electric and mechanical connection. Further, this flared shape having a "generally" decreasing diameter, the walls of the male element and of the female element necessarily come into contact with each other, and this, even if the manufacturing process used for their construction is imprecise.

Further, due to the corrugated shape of the mating portion of the female element, the force-fitting of the male element does not cause a significant stretching of the material forming this portion. Thus, the deformation undergone is not irreversible and the removal of the male element causes the returning of the mating portion to a shape close to the initial shape. The male element can thus be inserted back into the female element while providing an electric and mechanical connection of identical quality.

The interconnection is thus not definitive. Two circuits hybridized by means of such connection elements may thus be separated, for example, for testing, replacement, or other reasons, and be hybridized again.

The invention also aims at a male connection element intended to cooperate with a female connection element which comprises a hollow flared portion for receiving and guiding the male connection element and a hollow mating portion, formed in extension of the flared portion, for mating with the male connection element, wherein a portion to be mated of the male connection element is made of a deformable material and has a corrugated transverse cross section having an external diameter before the mating greater than the internal diameter before the mating of the mating portion of the female element, to contract when it is fitted into the mating portion.

In other words, the portion to be mated of corrugated cross-section ensures the reversibility of the interconnection, for reasons similar to those described hereabove.

The invention also aims at a system for connecting a first component to a second component, comprising at least a pair of male and female connection elements respectively attached to the first and second components. According to the invention:
- a female connection element comprises a hollow flared portion for receiving and guiding the male connection element and a hollow mating portion, formed in extension of the flared portion, for mating with the male connection element;
- a portion to be mated of the male connection element has an external diameter before the mating greater than an internal diameter of the mating portion of the female connection element;
- and the portion to be mated of the male connection element is made of a deformable material and has a corrugated transverse cross-section, to contract when it is fitted into the mating part of the female element, and/or the mating part of the female connecting element is made of a deformable material and has a corrugated transverse cross-section, to expand when the portion to be mated of the male element is fitted into it.

The invention also aims at a method for manufacturing a female connection element of the above-mentioned type, comprising:
- forming a layer capable of being etched;
- depositing on the layer capable of being etched a layer insensitive to etching comprising an opening having a corrugated profile;
- applying an isotropic etching on the opening to form, in the layer capable of being etched, the flared portion;
- applying an anisotropic etching on the opening to form, in the layer capable of being etched, the mating portion; and
- removing the layer insensitive to etching The invention also aims at a method for manufacturing a female connection element of the above-mentioned type, comprising:
- forming a stack of at least one upper layer and one lower layer capable of being etched, the upper layer being etched more rapidly than the lower layer;
- depositing on the upper layer a layer insensitive to etching and comprising an opening having a corrugated profile;
- applying an etching to the opening to form, in the at least two layers capable of being etched, the flared portion and the mating portion;
- removing the layer insensitive to etching According to an embodiment, the layer(s) capable of being etched are polymer layers of diimide type.

According to an embodiment of the invention, the method comprises depositing a metal layer on the internal wall of the etched portions.

According to an embodiment of the invention, the method comprises removing the layer(s) capable of being etched.

BRIEF DESCRIPTION OF THE DRAWINGS

The present invention will be better understood on reading of the following description provided as an example only in relation with the accompanying drawings, where the same reference numerals designate the same or similar elements, among which:

FIG. 1 is a simplified cross-section view of an interconnect according to a first state of the art;

FIG. 2 is a simplified cross-section view of an interconnect according to a second state of the art;

FIG. 3 is a simplified cross-section view of an interconnect according to the invention;

FIG. 4 is a simplified cross-section view along plane A-A of FIG. 3;

FIG. 5 is a simplified cross-section view along plane B-B of FIG. 3;

FIGS. 6 and 7 are simplified cross-section views illustrating the reception and the guiding of the male element by the flared portion of the female element;

FIG. 8 is a diagram illustrating the mating portion of the female connection element before the mating and after the mating with the male element;

DETAILED DESCRIPTION OF THE INVENTION

Figure 9:
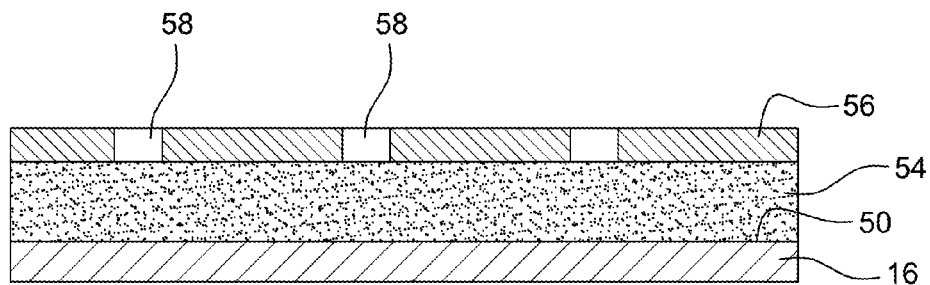
FIGS. 9 to 17 are simplified cross-section views illustrating a first method for manufacturing a female connection element according to the invention.

FIG. 3 shows an interconnect according to the invention. It comprises a hollow female metal connection element 30 comprising a flared portion 32 continued by a mating portion 34.

As shown in FIGS. 4 and 5, which are respective cross-section views along planes A-A and B-B of FIG. 3, female element 30 has a corrugated transverse cross-section, with an inscribed circle 36 of opening 38 having its diameter decreasing in flared portion 32 from opening 38 of female element 30 to mating portion 34, and having a substantially constant inscribed diameter 36 in mating portion 34.

Male connection element 10 takes the shape of a hollow metal cylinder. Its external diameter is smaller than the diameter of the inscribed circle 36 of opening 38 of female element 30, but is greater than inscribed diameter 36 of mating portion 34 of female element 30.

The materials forming male and female connection elements 10 and 30 are advantageously selected from among Cu and its compounds (CuBe, for example), Ni and its compounds (NiBe, for example), W and its compounds (WN and WSi, for example), Ti and its compounds (TiN and TiW, for example), Au and its compounds (AuSn, for example), and Pt and its compounds (PtSi, for example).

More specifically, the materials are selected to be both robust and fine electric conductors. Advantageously, the male elements may be made of a first material having a good mechanical resistance, such as, for example, CuBe, covered with a second material having a fine electric conduction, such as Au, for example.

As illustrated in FIGS. 6 and 7, flared portion 32 of female element 30 has the function of receiving male element 10 and of guiding it towards mating portion 34.

Advantageously, the inscribed diameter of opening 38 of female element 30 is larger than the external diameter of male element 10 by at least accuracy dL of the tool used to position male element 10 above female element 30 during the hybridizing of electronic circuits 14, 16. Thereby, it is ensured that male element 10 is inserted into female element 30.

Flared shape 32 further allows a self-alignment of elements 10 and 30. Indeed, when male element 10 comes into contact with the internal wall of flared portion 32, the vertical force exerted on this inclined wall creates in reaction a horizontal component which automatically aligns the two connection elements 10 and 30, as can be seen in FIG. 7. Male element 10 is thus perfectly aligned with the opening of mating portion 34.

The actual fitting of male element 10 into female element 30 is then performed by vertically pushing the male element into mating portion 34. Portion 34, which has an inscribed diameter 36 smaller than the external diameter of male element 10, then easily expands due to its corrugated profile, combined with the fact that it is formed of a deformable material, here a metal.

FIG. 8 illustrates the transverse cross-section of mating portion 34 before and after the mating of male element 10. As can be seen in this drawing, the cross-section of portion 34 passes from a corrugated profile 34a to a convex profile 34b having male element 10 inscribed therein. The element, force-fitted into mating portion 34, is then in contact therewith at many points, thus providing a reliable electric connection between the two connection elements 10, 30.

"Deformable" here means a material capable of undergoing the deformation caused by the force-fitting of the male element into mating portion 34 with no damage and reversibly. In practice, the deformability thus depends not only on the very nature of the material, but also on the thickness of the walls of mating portion 34 and on it corrugated profile. Still in practice, it is possible for any material to acquire this deformation quality, provided for the thickness and/or the corrugated profile to be appropriately selected.

Vertical force "F" exerted on male element 10 for its fitting into mating portion 34 of female element 30 determines the mating depth according to the involved geometries. As soon as the vertical resultant of the deformation forces is equal to force "F" exerted on the male element, the insertion is stopped.

Assuming as a first approximation that the deformation undergone by mating portion 34 is resilient, the de-inserting of the male element then requires a force opposite to force "F", mating portion 34 substantially returning to its initial shape as element 10 is being removed. It should thus be noted that the corrugated transverse profile of portion 34 behaves as a spring. Thus, it is possible to mate and unmate male and female elements 10 and 30 as often as desired.

In the described embodiment, male element 10 is a hollow metal cylinder. It is thus also deformed during its fitting. As a variation, the male element may be solid, in which case it undergoes substantially no deformation.

Further, the shape of the male element is not limited to a cylinder. The male element may for example be wider at its bottom than at its top, which enables to enhance the mechanical hold.

Further, an embodiment where the female element has a corrugated profile in its mating portion to be able to undergo a reversible deformation due to a spring effect has been described. As a variation, or complementarily to the corrugated profile of female element 30, the male element has a corrugated transverse cross-section so that it undergoes during its fitting a reversible contraction also implementing a spring effect.

Advantageously, both the male element and the female element have such a corrugated profile, so that the force necessary to plug these two elements is decreased.

It should further be noted that it is also possible to provide a filling of the female element with a solder material which fills the space between the male element and the female element and thus form an electric and mechanical joint. The use of a solder material obviously depends on the targeted application, but it should be noted that the corrugated profile of the male element and/or of the female element remains very advantageous. Indeed, for example, before definitively hybridizing two circuits together by using a solder material, preliminary tests may be carried out on each of them. A hybridization with no welding material is thus advantageously implemented, exploiting the reversibility of the mating of the male and female elements. Once tested and approved, the circuits are then ready for a definitive hybridization with the solder material.

Similarly, independently from the provided possibility of performing tests with a reversible mating, it should be noted that the force exerted to obtain a reliable mating of the female and male elements is much lower in the invention than the force necessary to force-fit male and female elements of circular cross-section. It should be noted on this regard that the stronger the exerted force, the more crucial the control of its verticality. Indeed, the transverse component of a non-vertical force induces a non-negligible risk of breakage of one or the other of the connection elements. It should easily be understood how delicate it can be to force-fit elements having walls of a thickness smaller than one micrometer.

A method for manufacturing female elements with a corrugated transverse cross-section on the surface of a microelectronic circuit to be hybridized will now be described in relation with FIGS. 9 to 17.

The male connection elements are hollow metal cylinders for example formed by means of the method described in document FR 2928033.

The method starts (FIG. 9) with the deposition, on surface 50 to be hybridized of a microelectronic circuit 16, of a so-called "sacrificial" layer 54 sensitive to etching, and preferentially formed in a polymer of polyimide type. This polymer has the advantage of withstanding high process temperatures, on the order of 350-400° C., for example, used during the deposition.

A layer 56 made of a hard material insensitive to etching, for example, made of SiO, of SiN, or of metal, is then deposited on sacrificial layer 54, after which openings 58 are formed through hard layer 56 at the locations desired for the female connection elements (FIG. 9).

Figure 10:
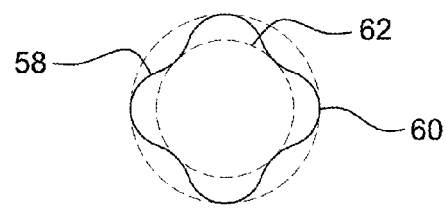
Figure 11:
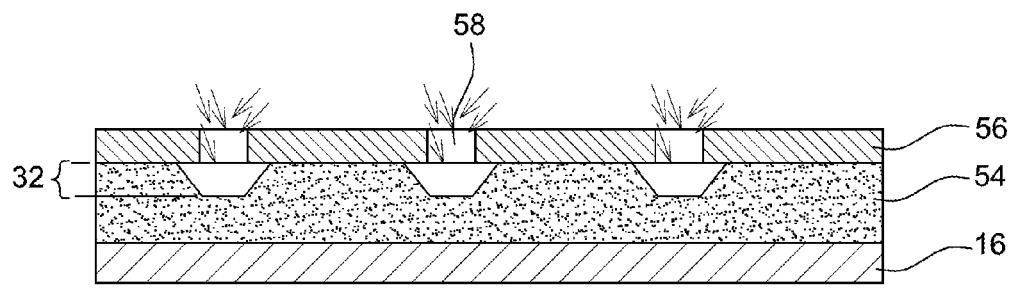

Openings 58, illustrated in top view in FIG. 10, are for example formed by photolithography by means of a mask, as known per se in the state of the art. Openings 58, all identical in the example, have a corrugated profile, are inscribed in an external circle "Cext" 60, and have an internal inscribed circle "Cint" 62.

As a numerical example, sacrificial layer 54 has a 5-micrometer thickness, diameter Cext of openings 58 is equal to 5.5 micrometers, and diameter Cint of openings 58 is equal to 4.5 micrometers.

The method then continues (FIG. 11) with the application of a partial isotropic etching of sacrificial layer 54 through openings 58, that is, an isotropic etching which is not performed across the entire thickness of layer 54. The etching is for example performed by application of a high-pressure $O_2$ plasma without the assistance of a directional ion bombarding or by application of a liquid chemical product, such as a liquid polyimide etching described in document U.S. Pat. No. 4,846,929 or an etching with TMAH (tetramethylammonium hydroxide).

Figure 12:
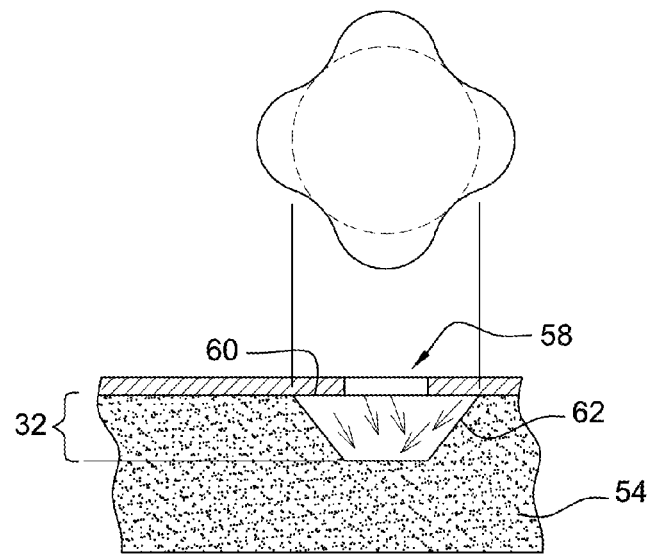
Figure 13:
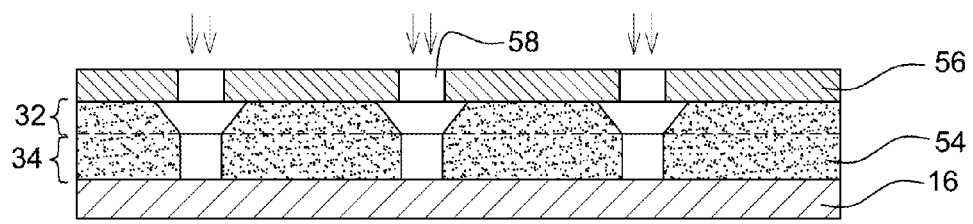
Figure 14:
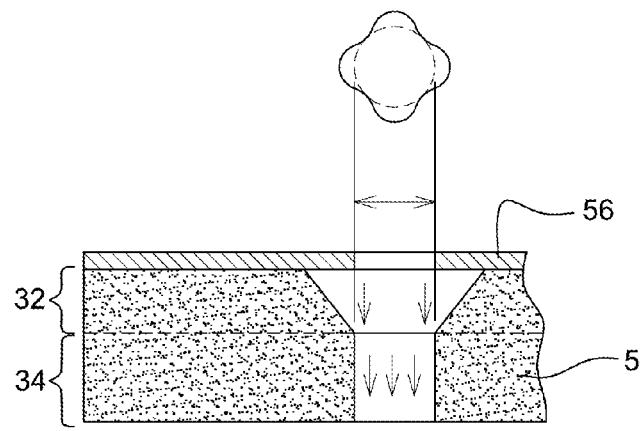
Figure 15:
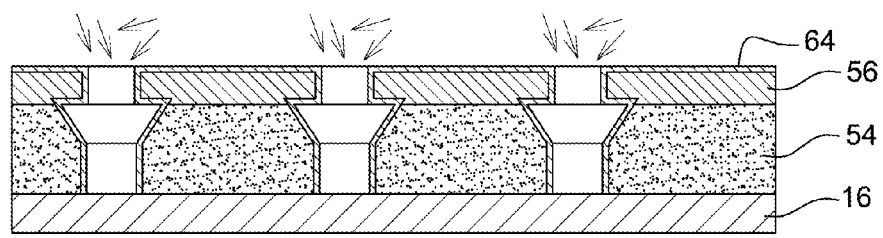
Figure 16:
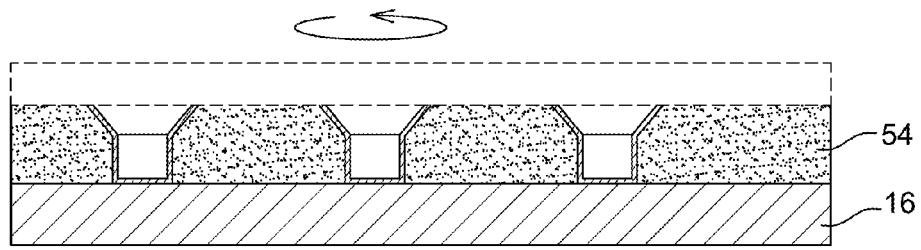

The isotropic etching thus etches the polymer of sacrificial layer 54 in all directions. As can be seen in FIG. 12, a lateral overetching 60 is performed under hard layer 56. Further, the isotropic etching etches sacrificial layer 54 according to an isotropy slope 62, having its value depending on the features of the etching process. For example, in an oxygen plasma etching, by varying the voltage between the electrodes for controlling plasma discharges, a vertical anisotropic mechanical "ion" assistance is created. More specifically, isotropy slope 62 increases if the voltage increases. It should be noted that other parameters may be varied and that the control of the isotropy slope is a perfectly-controlled mechanism.

Especially, as concerns the obtaining of isotropy slope 62, several tests with different parameter values may be carried out until the desired isotropy slope 62 is obtained.

Different parameters of the plasma etch method may be varied, in particular:
the etching time,
the gas flow rate (essentially oxygen, nitrogen),
the gas pressure: for example, when the pressure increases in the etch chamber, the etching is more isotropic.
the power:
applied to the wafer: by increasing this power, the etching is more anisotropic
applied to the source: by increasing this power, the etching is more isotropic, Flared portion 32 of the female connection elements is thus formed.

Further, the etching, be it isotropic or not, etches sacrificial layer 54 so that, whatever the considered height in sacrificial layer 54, the transverse cross-section of an etched portion of sacrificial layer 54 is homothetic to the corresponding opening 58.

In the numerical example, the isotropy slope is equal to 30° during the etching of the first two micrometers of sacrificial layer 54, that is, each micrometer of etching through the thickness of sacrificial layer 54 results in a lateral widening of the dimensions by 0.5 micrometer per side under hard layer 56 and in no widening at the bottom of the etching Thus, by stopping the etching when it has etched 2 micrometers of the thickness of sacrificial layer 54, the portion etched in an opening 58 is characterized, sizewise, by:

under hard layer 56:
an inner circle having its diameter increasing from 4.5 to 6.5 micrometers;
an outer circle having its diameter increasing from 5.5 to 7.5 micrometers;
at a depth of 2 micrometers under hard mask 56:
an inner circle having its diameter remaining at 4.5 micrometers;
an outer circle having its diameter remaining at 5.5 micrometers.

In practice, the dimensions of openings 58 are selected to take into account lateral underetching. Thus, for example, if the male element intended to cooperate with a female element is a cylinder having a diameter equal to 5 micrometers, and the precision of the machines used to mate the male and female elements is equal to 0.5 micrometer, openings 58 in the hard mask are selected so that their outer circle has a diameter equal to 5.5 micrometers and their inner circle has a diameter equal to 4.5 micrometer, thus providing flared upper portions of the female elements having an internal circle diameter at the opening equal to 6.5 micrometers compatible with the precision of the machines.

The method then carries on with the application of an anisotropic etching across the remaining thickness of sacrificial polymer layer 54, such as for example the application of a low-pressure $O_2$ plasma assisted by a directional ion bombarding (FIGS. 13 and 14) or for example the application of an ion etching.

The anisotropy of the etching thus results in applying the geometry of openings 58 to the remaining thickness of sacrificial layer 54 with no lateral overetching. Mating portion 34 of the female connection elements is thus formed in extension of flared portion 32 with a transverse cross-section substantially identical to the profile of openings 58, and thus especially a corrugated transverse cross-section having a diameter of its inscribed circle equal to 4.5 micrometers in the numerical example.

The method then carries on with the conformal deposition of a hard metal layer 64, advantageously made of CuBe, over the surface of the assembly (FIG. 15), that is, the thickness of the hard metal deposition is constant over the entire surface that it covers, including on flared portion 32. Advantageously, a CVD (chemical vapor deposition) is performed to form hard metal layer 64.

Hard metal layer 64 thus deposits on the internal wall of the etched portions of sacrificial layer 54, which enables to form mechanically resistant and electrically conductive walls. Preferably, the deposition is performed by means of a chemical vapor deposition, this type of deposition ensuring a good conformality of the layer deposited on the wall of the etched portions. For example, a copper layer having a 0.2-micrometer thickness is deposited.

A mechanical polishing is then carried out to remove hard metal layer 64 and hard layer 56 from the surface of the assembly, to expose sacrificial layer 54 (FIG. 16) and electrically isolate the female connection elements from one another.

Figure 17:
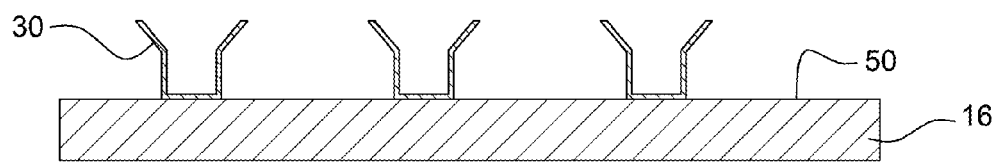

In a first variation, the method carries on with the removal of sacrificial layer 54, to disengage female connection elements 30 (FIG. 17). The method then optionally carries on with the deposition on female elements 30 of a gold layer, for example, having a 0.1-micrometer thickness, to preserve a good surface quality. Such a gold layer especially enables to avoid an oxidation of the hard material of female elements 30 when the component is stored before use. Indeed, when no specific precaution is taken, a native oxide naturally forms at the surface of the hard material of female elements 30, which adversely affects the quality of the electric connection subsequently formed with the male elements.

Similarly, the male connection elements are also covered with a gold layer. This is for example performed by depositing a gold layer, and then etching by means of a mask enabling to etch the gold layer around each male and female connection element, to only cover them with a gold layer, with an optional overlapping of a limited area around each of them.

Figure 18:
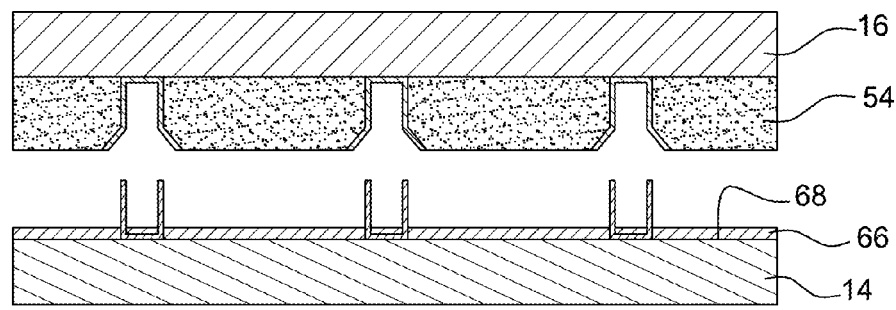
FIGS. 18 and 19 are simplified cross-section views illustrating an interconnect with a filling material between the two hybridized circuits.
Figure 19:
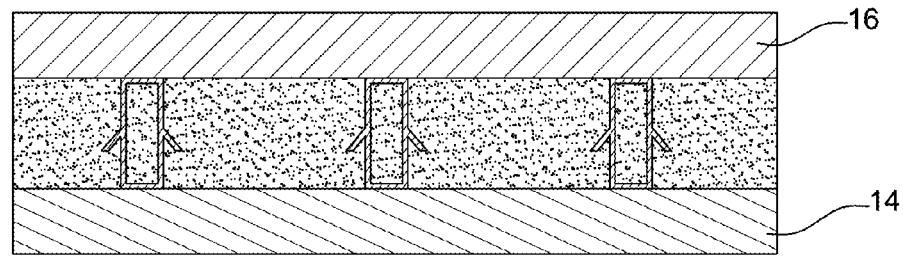

In a second alternative embodiment, sacrificial layer 54 is maintained to form a filling material between the two hybridized circuits, as shown in FIGS. 18 and 19, which show the circuits to be hybridized respectively before and after the mating of male and female elements 10 and 30. It should be noted that the material of sacrificial layer 54, preferentially a polymer of diimide type, has a resilience enabling it to deform on insertion of the male elements, which enables to keep the sacrificial layer and thus to increase the mechanical resistance of the assembly once the circuits have been hybridized.

Thus, method steps are spared since the hybridization by means of hollow elements is usually completed with a coating step to protect the elements, which are more fragile than solder ball interconnects used in prior art. Further, sacrificial layer 54 has by construction a good flatness due to the process used to remove hard layers 56 and 64, which enables to correct the lack of flatness of the lower substrate, to improve connection efficiencies. Further, due to polyimide of sacrificial layer 54, possible height differences, such as steps, for example, can be compensated.

Advantageously, should the application require it, surface 66 of second circuit 14 having male elements 10 formed thereon is covered with a layer 68 of polymerizable material, and advantageously a material polymerizable in two steps, such as for example an epoxy resin, such as disclosed in document U.S. Pat. No. 7,579,392. This type of resin, commonly called "Bstage", has the advantage of reticulating in two heating steps. In a first heating step at a first temperature, the resin partially reticulates and passes from a liquid state to a malleable state, which enables to shape it. After a second heating step, at a second temperature higher than the first temperature, the resin then completely reticulates and thus becomes solid.

This enables to bond first and second circuits 14 and 16 together after hybridization by "face-to-face" bonding, with layer 68 of polymerizable material being spread in a thin film when in its malleable state after the first heating step, and then positive connecting circuits 14 and 16 by the solidification of layer 68 of polymerizable material after the second heating step, as for example described in document U.S. Pat. No. 7,579,392.

Optionally and according to the targeted application, the internal surface of female elements 30 is covered with a layer of solder material 70 to form a mechanical and electric joint once the male elements have been fitted.

As mentioned hereabove, the male connection elements are for example formed by means of the method described in document FR 2928033.

As a variation, the male elements may be formed similarly to the previously-described method by etching a sacrificial layer by means of a purely anisotropic etching. The openings formed in the hard layer covering the sacrificial layer are circular, in which case cylindrical and hollow male elements are obtained, or have a corrugated profile, in which case hollow male elements of corrugated transverse cross-section are obtained.

In the previously-described method, the height of flared portion 32 of the female connection elements is determined by the duration of the isotropic etching applied to sacrificial layer 54. Now, however neatly the material of sacrificial layer 54 is formed and the etching is performed, inhomogeneities may nevertheless appear during the etching, thus resulting in flared portions 32 of different heights, and thus in a subsequent hybridization of poorer quality.

Figure 20:
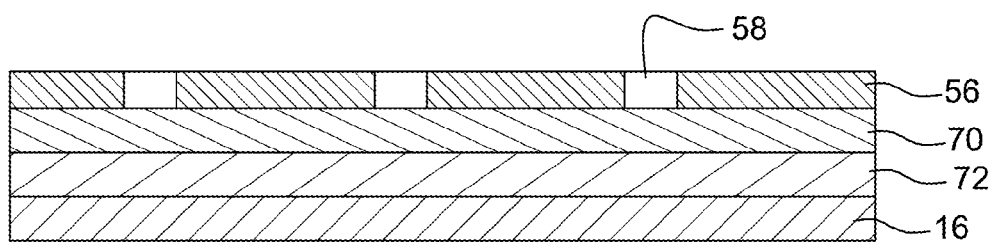
FIGS. 20 and 21 are simplified cross-section views illustrating a second method for manufacturing a female connection element according to the invention.

A second method for manufacturing the female connection elements according to the invention, enabling to more precisely control the height of the flared portions of the female connection elements, and this whatever the quality of the etched material and whatever the quality of the etching, will now be described in relation with FIGS. 20 and 21.

According to this second embodiment, sacrificial layer 54 is replaced with a stack of two polymer layers 70, 72, advantageously of diimide type, which are etched at different rates (FIG. 20), upper polymer layer 70 being etched faster than lower polymer layer 72.

An isotropic etching is then performed in upper polymer layer 70 all the way to lower polymer layer 72, similarly to the isotropic etching of sacrificial layer 54 of the previous embodiment. Flared portions 32 are then formed. Especially, just as for the previous embodiment, the profile of openings 58 is transferred to the etched portions which thus have sections homothetic to the profile.

However, unlike in the previous embodiment, lower polymer layer 72 here is used as a stop layer for the etching performed in upper polymer layer 70. Especially, by selecting a lower polymer layer 72 etched at a much lower rate than upper polymer layer 70, the etching thereof substantially stops at the interface with lower polymer layer 72. The height of flared portions 32 is then set by the height of upper polymer layer 70, and thus by its forming process, that is, for example, the deposition process used.

Figure 21:
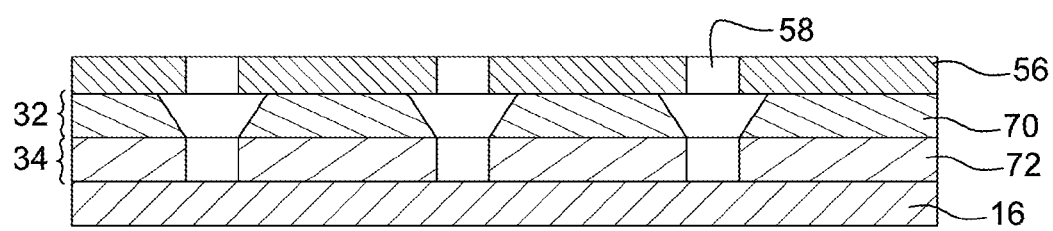

The method then carries on with the application of an anisotropic etching, which then forms in lower polymer layer 70 mating portions 34 of the female connection elements, similarly to the first embodiment (FIG. 21). Especially, as for the previous embodiment, the profile of openings 58 is transferred to the etched portions, which then have sections homothetic to the profile.

Advantageously, upper and lower polymer layers 70 and 72 are etched during a same etch process, for example, by means of an O$_2$ plasma etching. As known per se, the isotropic and anisotropic character of the etching may be set by means of the voltage used for the plasma discharge.

Once the upper and lower sacrificial layers have been etched, the method then carries on similarly to the method according to the first embodiment.

The present invention provides the following advantages:
- a simplified positioning of the male element in front of the female element, which requires no high-precision tools. This positioning may further be performed at ambient temperature while the state of the art using solderings requires taking the assembly to at least the melting temperature of the solder material, and/or taking the assembly to a very high pressure to decrease the melting temperature of the solder material;
- an intrinsic self-alignment of the male and female elements;
- a reversible mating, since the male and female elements may be mated and unmated if necessary. This enables to replace defective circuits, to previously test the circuits to be hybridized, advantageously by means of a limited number of test circuits, or a single one, specifically designed for this purpose;
- the possibility not to use a solder material to provide an electric connection. The absence of solder material especially enables to take the hybridized assembly to high temperatures if necessary, as for example in the case of a board soldering. Indeed, in the absence of solder material, no specific precaution is to be taken relative to the interconnections between male and female elements;
- a low fitting force sufficient to mate the male and female elements;
- a less expensive mating method, capable of operating at a high rate. Indeed, a positioning machine of "pick and place" type, which is fast but may have a limited precision, may be used to pre-insert the male elements into the female elements at a high rate, that is, partially mating these elements due to the intrinsic self-alignment according to the invention, after which the circuits thus partially hybridized may be displaced together with no risk of misalignment to another specific machine which performs the final mating of all connection elements. A significant gain in production rate is thus obtained;

the possibility of creating "upgradeable" boards or multiple chip modules (MCM): a chip version may be replaced with a more advanced version due to the interconnects according to the invention. This type of hardware upgrading is both easy to implement by constructors and difficult to implement by other people which do not have tools allowing an alignment with a precision on the order of one micrometer.

The invention claimed is:

1. A female electrical connection element of electrical components comprising a hollow flared guiding portion for receiving and guiding a male electrical connection element and a hollow mating portion, formed in continuation of the flared guiding portion, for mating with the male electrical connection element, wherein the guiding portion has an opening, said opening having an internal diameter greater than an external diameter of the male connection element, an internal diameter of the guiding portion decreases from the opening down to the hollow mating portion, the hollow mating portion has an internal diameter smaller than the external diameter of the male connection element, and the hollow mating portion is made of a deformable material and the female connection element has a corrugated transverse cross-section over an entire height of the female connection element.

2. A male electrical connection element of electrical components cooperating with a female electrical connection element which comprises a hollow flared guiding portion for receiving and guiding the male electrical connection element and a hollow mating portion, formed in extension of the flared guiding portion, for mating with the male electrical connection element, wherein the guiding portion of the female connection element has an opening, said opening having an internal diameter greater than an external diameter of the male connection element, an internal diameter of the guiding portion of the female connection element decreases from the opening down to the hollow mating portion, the male connection element has an external diameter greater than an internal diameter of the hollow mating portion of the female connection element, and the male connection element is made of a deformable material and has a closed corrugated transverse cross-section over an entire height of the male connection element.

3. A system for connecting a first electrical component to a second electrical component, comprising at least one pair of male and female electrical connection elements respectively attached to the first and second electrical components:

wherein the female connection element comprises a hollow flared guiding portion for receiving and guiding the male connection element and a hollow mating portion, formed in extension of the flared guiding portion, for mating with the male connection element;

wherein a portion of the male connection element to be mated in the hollow mating portion of the female connection element has an external diameter before the mating greater than an internal diameter of the hollow mating portion of the female connection element;

wherein the guiding portion of the female connection element has an opening, said opening having an internal diameter greater than an external diameter of the male connection element;

wherein an internal diameter of the guiding portion of the female connection element decreases from the opening down to the hollow mating portion; and wherein the female connection element is made of a deformable material and has a closed corrugated transverse cross-section over an entire height of the female connection element.

4. A system for connecting a first electrical component to a second electrical component, comprising at least one pair of male and female electrical connection elements respectively attached to the first and second electrical components:

wherein the female connection element comprises a hollow flared guiding portion for receiving and guiding the male connection element and a hollow mating portion, formed in extension of the flared guiding portion, for mating with the male connection element;

wherein a portion of the male connection element to be mated in the hollow mating portion of the female connection element has an external diameter before the mating greater than an internal diameter of the hollow mating portion of the female connection element;

wherein the guiding portion of the female connection element has an opening, said opening having an internal diameter greater than an external diameter of the male connection element;

wherein an internal diameter of the guiding portion of the female connection element decreases from the opening down to the hollow mating portion; and wherein said portion of the male connection element is made of a deformable material and has a closed corrugated transverse cross-section over an entire height of the male connection element.

* * * * *